United States Patent
Li et al.

(10) Patent No.: US 8,773,625 B2
(45) Date of Patent: Jul. 8, 2014

(54) METHOD OF MANUFACTURING FLEXIBLE SUBSTRATE STRUCTURE AND FLEXIBLE FLAT DEVICE

(75) Inventors: Wen-Yuan Li, Hsin-Chu (TW);
Pin-Hsiang Chiu, Hsin-Chu (TW);
Yu-Chieh Hsueh, Hsin-Chu (TW);
Li-Yin Chen, Hsin-Chu (TW);
Min-Chih Wei, Hsin-Chu (TW);
Shiuan-Iou Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 108 days.

(21) Appl. No.: 13/479,252

(22) Filed: May 23, 2012

(65) Prior Publication Data

US 2013/0077033 A1    Mar. 28, 2013

(30) Foreign Application Priority Data

Sep. 23, 2011    (TW) .............................. 100134432 A (51) Int. Cl.
*G02F 1/13* (2006.01)
*G02F 1/1333* (2006.01)
*B32B 5/14* (2006.01)
*B32B 7/12* (2006.01)
*H01L 27/12* (2006.01)

(52) U.S. Cl.
CPC .......... *G02F 1/1333* (2013.01); *G02F 2202/28* (2013.01); *G02F 1/133305* (2013.01); *B32B 5/142* (2013.01); *B32B 7/12* (2013.01); *H01L 27/1266* (2013.01)
USPC ...................................................... 349/122

(58) Field of Classification Search
CPC ...................................................... G02F 1/13452
USPC ........................................................... 349/122
See application file for complete search history.

(56) References Cited

U.S. PATENT DOCUMENTS

| 6,667,250 | B2 | 12/2003 | Sasaoka | |
|---|---|---|---|---|
| 6,802,926 | B2 | 10/2004 | Mizutani | |
| 7,825,002 | B2 | 11/2010 | Takayama | |
| 2006/0254704 | A1* | 11/2006 | Seo et al. ....................... | 156/249 |
| 2008/0099134 | A1* | 5/2008 | Tadakuma .................... | 156/250 |
| 2009/0207370 | A1* | 8/2009 | Tsuchiya et al. .............. | 349/153 |
| 2010/0167437 | A1* | 7/2010 | Yamazaki et al. ............. | 438/26 |
| 2010/0203296 | A1 | 8/2010 | Tsai | |

(Continued)

FOREIGN PATENT DOCUMENTS

| CN | 102176435 A | 9/2011 |
|---|---|---|
| JP | 201010247 A | 1/2010 |

(Continued)

*Primary Examiner* — Bumsuk Won
*Assistant Examiner* — Edmond Lau
(74) *Attorney, Agent, or Firm* — Winston Hsu; Scott Margo (57) ABSTRACT

A method of manufacturing a flexible substrate structure includes the following steps. A first loading substrate having a center area and a peripheral area is provided. A first adhesive layer is formed on the center area of the first loading substrate, and a second adhesive layer is formed on the peripheral area of the first loading substrate. The first flexible substrate is adhered to the first loading substrate by the first adhesive layer and the second adhesive layer to form a flexible substrate structure, wherein the adhesive force between the first flexible substrate and the second adhesive layer is stronger than that between the first flexible substrate and the first adhesive layer. The flexible substrate structure is cut, and the first flexible substrate is separated from the flexible substrate structure.

10 Claims, 9 Drawing Sheets

(56) References Cited

U.S. PATENT DOCUMENTS

2011/0228492 A1* 9/2011 Haq et al. .................. 174/254
2011/0310344 A1* 12/2011 Yang et al. .................. 349/153
2012/0164408 A1 6/2012 Hwu

FOREIGN PATENT DOCUMENTS

| TW | 201030693 | 8/2010 |
| TW | 201115249 | 5/2011 |
| TW | 201234947 | 8/2012 |

* cited by examiner

METHOD OF MANUFACTURING FLEXIBLE SUBSTRATE STRUCTURE AND FLEXIBLE FLAT DEVICE

BACKGROUND OF THE INVENTION

1. Field of the Invention

The present invention relates to a method of manufacturing a flexible substrate structure and a flexible flat device, and more particularly, to a flexible flat device applicable in display device or optical element.

2. Description of the Prior Art

Liquid crystal display (LCD) display is advantageous for its light weight and thin thickness when it is compared to conventional cathode ray tube (CRT) display. However, the disadvantage of the LCD display is its fragility and unbendable property due to the glass substrates inside. As the result, flexible display with soft substrate, such as plastic substrate or the like, gradually draws public attention.

The conventional process of manufacturing flexible display includes attaching the soft substrate, such as plastic substrate or the like, on the glass substrate in the beginning. Then, the circuit is formed on the plastic substrate, and the plastic substrate and the glass substrate are separated in the end. However, because of the high temperature generated in the process of forming circuit, the product yield would be affected by separation between the plastic substrate and glass substrate due to differences of thermal expansion coefficients.

On another aspect, if plastic substrate and glass substrate are adhered tightly, it will cost much time to separate the plastic substrate and the glass substrate in the following process. For instance, when a laser method, which could gasify the adhesive layer, is used to separate the substrates, it is necessary to gasify the entire adhesive between the surfaces of two substrates before separating. It will cost more time when the plastic substrate area becomes lager, and the laser damage of the circuit on plastic substrate is concerned. Therefore, it is disadvantageous in mass production.

SUMMARY OF THE INVENTION

An object of the present invention is to provide a flexible substrate structure, to prevent separation of flexible substrate from the loading substrate when the circuit is manufactured on the flexible substrate, but to separate easily when the manufacturing process ends. Therefore, the present invention not only increases the yield but also decreases the manufacturing time.

In order to achieving the purpose, this invention provides a method of manufacturing flexible substrate structure including the following steps. A first loading substrate having a center area and a peripheral area disposed on at least one side of center area is provided. A first adhesive layer is formed on the center area of the first loading substrate, and a second adhesive layer is formed on the peripheral area of the first loading substrate. The first flexible substrate is adhered to the first loading substrate by the first adhesive layer and the second adhesive layer to form a flexible substrate structure. The adhesive force between the first flexible substrate and the second adhesive layer is stronger than that between the first flexible substrate and the first adhesive layer. The flexible substrate structure is cut, and the first flexible substrate is separated form the flexible substrate structure.

In order to achieving the purpose, this invention provides a method of manufacturing flexible flat device including the following steps. A first loading substrate having a center area and a peripheral area disposed on at least one side of center area is provided. A first adhesive layer is formed on the center area of the first loading substrate, and a second adhesive layer is formed on the peripheral area of the first loading substrate. The first flexible substrate is adhered to the first loading substrate by the first adhesive layer and the second adhesive layer. The adhesive force between the first flexible substrate and the second adhesive layer is stronger than that between the first flexible substrate and the first adhesive layer. A second loading substrate having a center area and a peripheral area disposed on at least one side of the center area is provided. A third adhesive layer is formed on the center area of the second loading substrate, and a fourth adhesive layer is formed on the peripheral area of the second loading substrate. A second flexible substrate is adhered to the second loading substrate by the third adhesive layer and the fourth adhesive layer. The adhesive force between the second flexible substrate and the fourth adhesive layer is stronger than that between the second flexible substrate and the third adhesive layer. The first flexible substrate is adhered to the second flexible substrate by a fifth adhesive layer to form a flexible substrate structure. The adhesive force between the first flexible substrate and the fifth adhesive layer is stronger than that between the first flexible substrate and the second adhesive layer, and the adhesive force between the second flexible substrate and the fifth adhesive layer is stronger than that between the second flexible substrate and the fourth adhesive layer. Then, the flexible substrate structure is cut, and the first flexible substrate and the second flexible substrate are separated form the flexible substrate structure.

In order to achieving the purpose, this invention also provides a flexible flat device including a first loading substrate, a first adhesive layer, a second adhesive layer, a first flexible substrate, a second loading substrate, a third adhesive layer, a forth adhesive layer, a second flexible substrate and a fifth adhesive layer. The first loading substrate has a center area and a peripheral area disposed on at least one side of center area. The first adhesive layer is disposed in the center area of the first loading substrate, and the second adhesive layer is disposed in the peripheral area of the first loading substrate. The first flexible substrate is adhered to the first loading substrate by the first adhesive layer and the second adhesive layer. The adhesive force between the first flexible substrate and the second adhesive layer is stronger than that between the first flexible substrate and the first adhesive layer. The second loading substrate is disposed oppositely to the first loading substrate. The second loading substrate has a center area and a peripheral area disposed on at least one side of the center area. The third adhesive layer is disposed on the center area of the second loading substrate, and a fourth adhesive layer is disposed on the peripheral area of the second loading substrate. The second flexible substrate is adhered to the second loading substrate by the third adhesive layer and the fourth adhesive layer. The adhesive force between the second flexible substrate and the fourth adhesive layer is stronger than that between the second flexible substrate and the third adhesive layer. The fifth adhesive layer is disposed between the first flexible substrate and the second flexible substrate for adhering the first flexible substrate to the second flexible substrate. The adhesive force between the first flexible substrate and the fifth adhesive layer is stronger than that between the first flexible substrate and the second adhesive layer, and the adhesive force between the second flexible substrate and the fifth adhesive layer is stronger than that between the second flexible substrate and the fourth adhesive layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
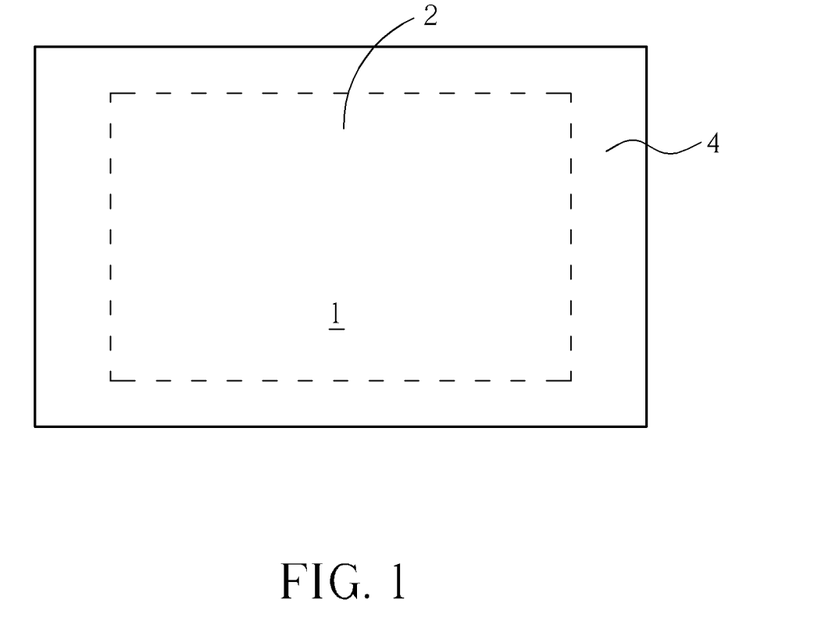
FIG. 1 to FIG. 8 are schematic diagrams illustrating a method of manufacturing a flexible substrate structure in accordance to the first embodiment of the present invention.
Figure 2:
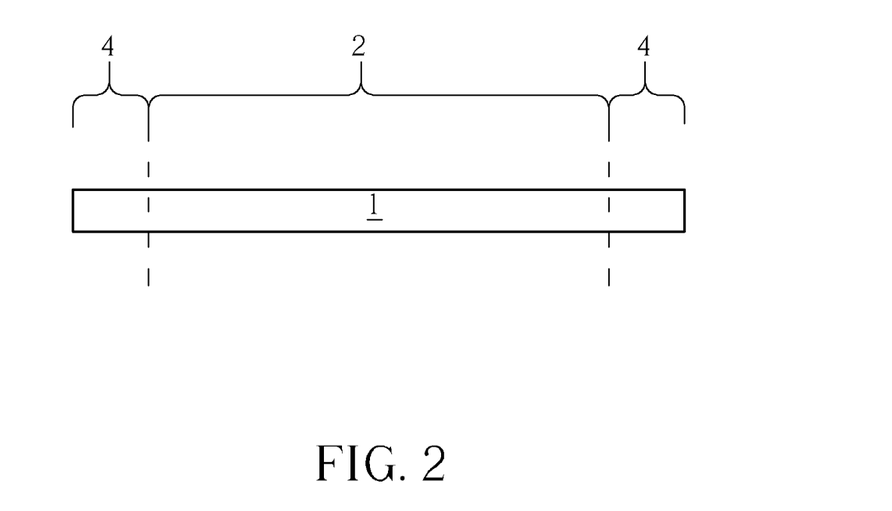

Referring to FIG. 1 to FIG. 8, FIG. 1 to FIG. 8 are schematic diagrams illustrating a method of manufacturing the flexible substrate structure in accordance to the first embodiment of the present invention. FIG. 1 is the top view of this embodiment and FIG. 2 to FIG. 8 are the cross-sectional views of this embodiment. As illustrated in FIG. 1 and FIG. 2, a first loading substrate 1 is provided first. The first loading substrate 1 has a center area 1 and a peripheral area 4 disposed on at least one side of the center area 2. The peripheral area 4 can be selectively disposed on one side, two sides, three sides or four sides of the center area 1. In this embodiment, the peripheral area 4 is disposed on four sides of the center area 2. In other words, the peripheral area 4 surrounds the center area 2, but is not limited. The first loading substrate 1 is required to endure high temperature in the manufacturing process without deformation. For instance, the glass substrate for manufacturing liquid crystal display may be a choice but is not a limitation. Other hard substance substrates which satisfy the high temperature requirement could be possible choices.

Figure 3:
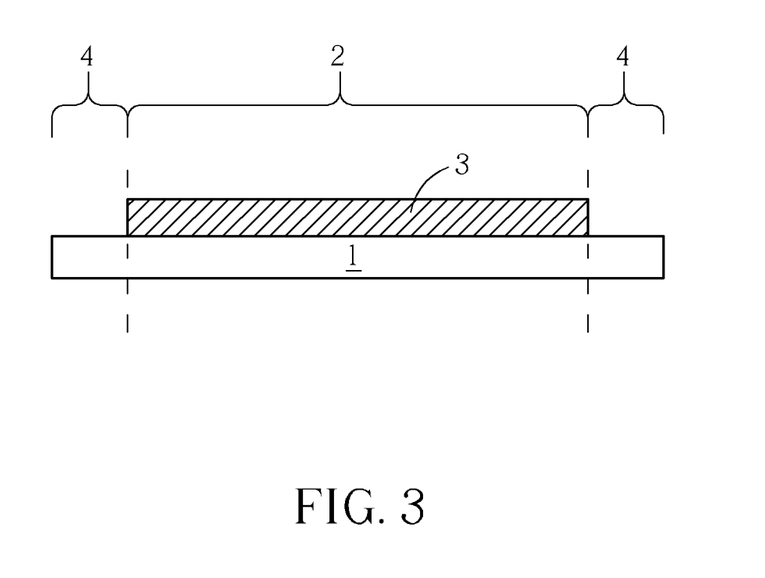
Figure 4:
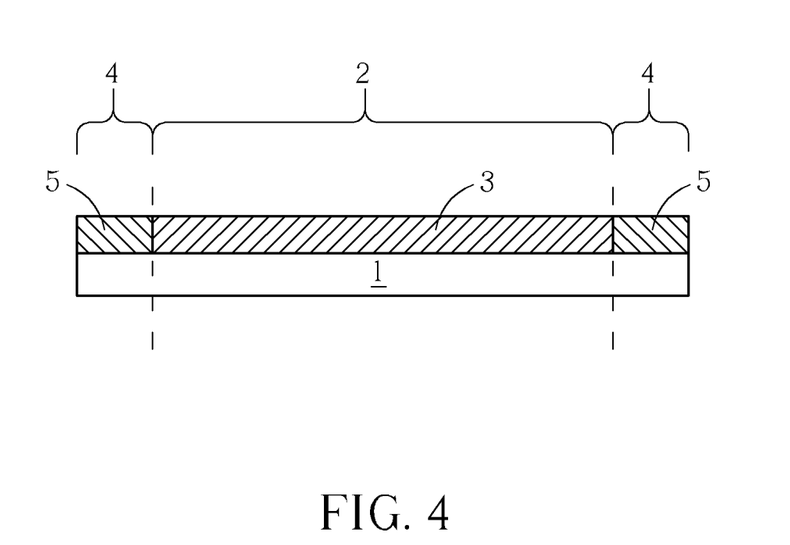
Figure 5:
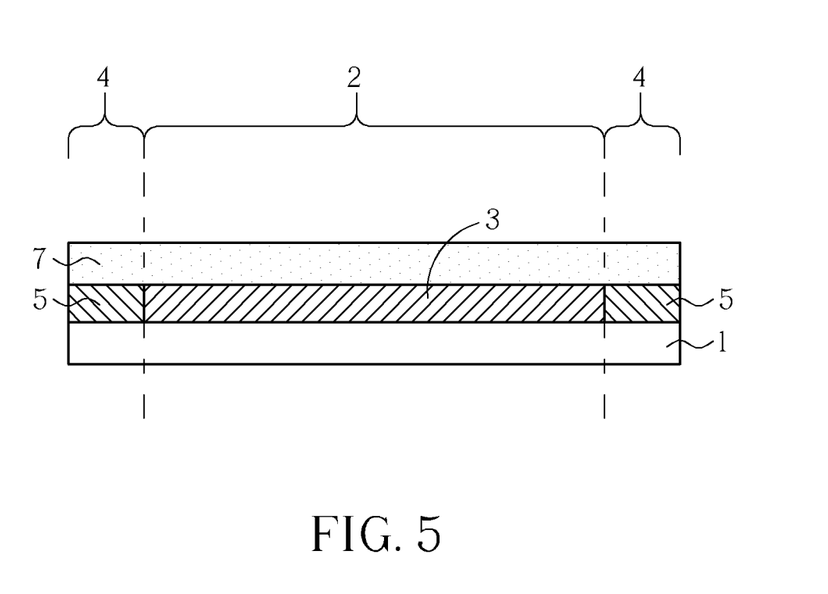

As illustrated in FIG. 3, next, a first adhesive layer 3 is formed on the center area 2 of the first loading substrate 1. As illustrated in FIG. 4, a second adhesive layer 5 is formed on the peripheral area 4 of the first loading substrate 1. The second adhesive layer 5 is formed around the first adhesive layer 3 and connects to the first adhesive layer 3. As illustrated in FIG. 5, a first flexible substrate 7 is adhered to the first loading substrate 1 by the first adhesive layer 3 and the second adhesive layer 5 to form a flexible substrate structure. The first flexible substrate 7 is flexible so that the bending ability of first flexible substrate 7 under external force is better than that of the first loading substrate 1. Besides that, other properties are needed to be concerned, e.g. visible light transparency, thermal expansion coefficient, surface roughness, water penetration ability, and solvent resistance. With considering all the requirement mentioned above, the material of the first flexible substrate 7 could be selected from polyimide (PI), cyclo-olefin-copolymer (COC), PMMA, PET, PEN, PES, polycarbonate (PC), copolyester thermoplastic elastomer (COP), polysulfone, phenolic resin, epoxy resin, polyester, polyetherester, polyetheramide, cellulose acetate, aliphatic polyurethane, polyacrylonitrile, polytetrafluoroethylenes, polyvinylidene fluorides, polytetrafluoroethylenes, HDPEs, poly(methyl α-methacrylates) and combination thereof, but is not limited.

The adhesive force between the first flexible substrate 7 and the second adhesive layer 5 is stronger than that between the first flexible substrate 7 and the first adhesive layer 3. For instance, the adhesive force between the first flexible substrate 7 and the second adhesive layer 5 is substantially more than 0.15 N/inch, but the adhesive force between the first flexible substrate 7 and the first adhesive layer 3 is substantially less than 0.05 N/inch. Besides, the adhesive force between the first adhesive layer 3 and the first loading substrate 1 is preferably stronger than that between the first adhesive layer 3 and the first flexible substrate 7. In that way, the first adhesive layer 3 would not be left on the first flexible substrate 7 when the first loading substrate 1 and the first flexible substrate 7 are separated, so that additional clean step could be omitted. The adhesive force is defined by the minimum force to separate the first flexible substrate 7 and the first loading substrate 1. When external force is stronger than the adhesive force, the purpose of separating the substrates could be achieved. Besides, in order to prevent the movement between the first flexible substrate 7 and the first loading substrate 1 in the manufacturing process, the area ratio of the peripheral area 4 to the center area 2 should be substantially more than 0.5, but is not limited to this.

Figure 6:
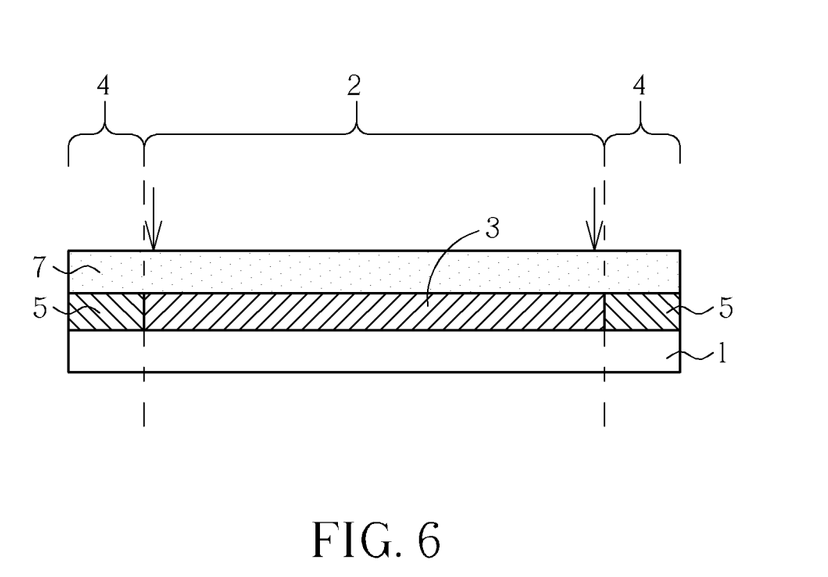

As illustrated in FIG. 6, a cutting process is conducted next. The first loading substrate 1 and first flexible substrate 7 are cut along the fringe of the center area 2 of the first loading substrate 1 to separate the center area 2 and the peripheral area 4, as indicated by arrow in FIG. 6. Furthermore, the "fringe" means the inner side area of the center area 2. In this embodiment, the laser cutting method could be adopted in cutting process but is not limited. Any process, e.g. the wheel cutting method or other cutting methods, could be adopted in the cutting process of this invention as long as the methods can be used to cut the first loading substrate 1 and the first flexible substrate 7 at the same time.

Figure 7:
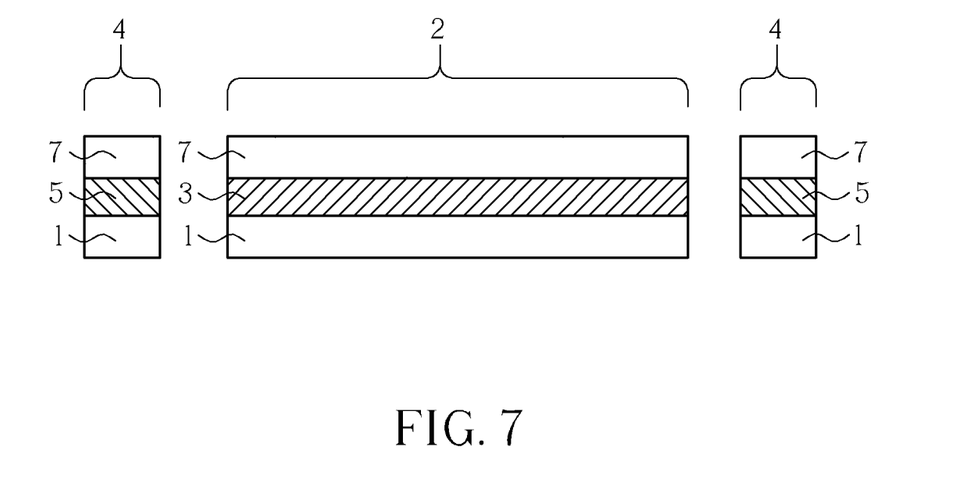
Figure 8:
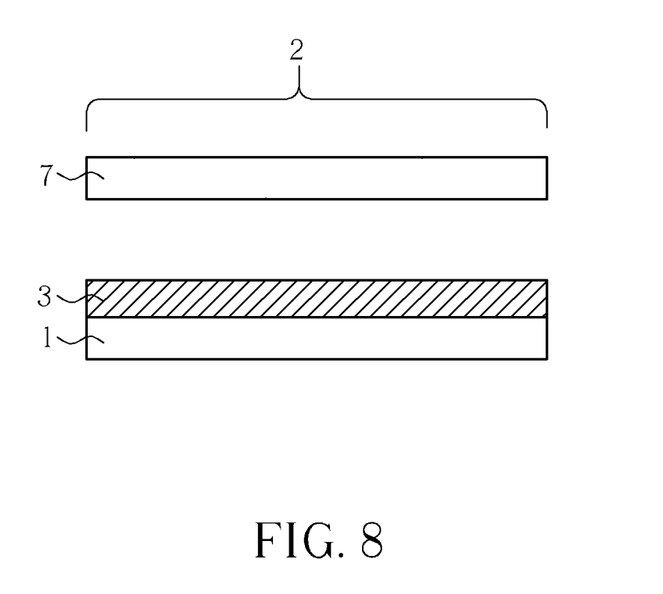

As illustrated in FIG. 7, the peripheral area 4 and the center area 2 of the first loading substrate are separated after the cutting process. This results that part of the first flexible substrate 7 after cutting is adhered to the center area 2 of the first loading substrate 1 by the first adhesive layer 3. As illustrated in FIG. 8, since the adhesive force between the first adhesive layer 3 and the first loading substrate 1 is stronger than that between the first adhesive layer 3 and the first flexible substrate 7, the first flexible substrate 7 can be easily separated from the center area 2 of the first loading substrate 1 after cutting when the external force is applied between the first flexible substrate 7 and the first adhesive layer 3.

Figure 9:
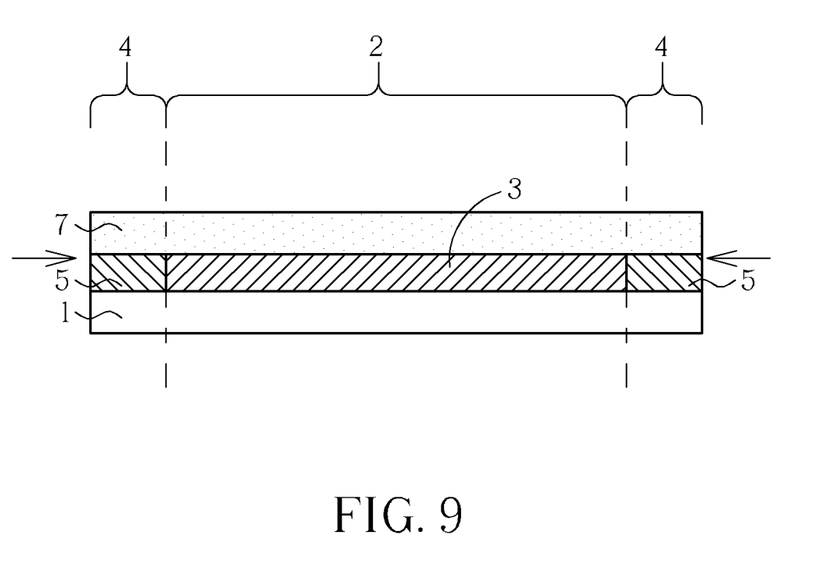
FIG. 9 and FIG. 10 are schematic diagrams illustrating a method of manufacturing a flexible substrate structure in accordance to the variety of the first embodiment of the present invention.
Figure 10:
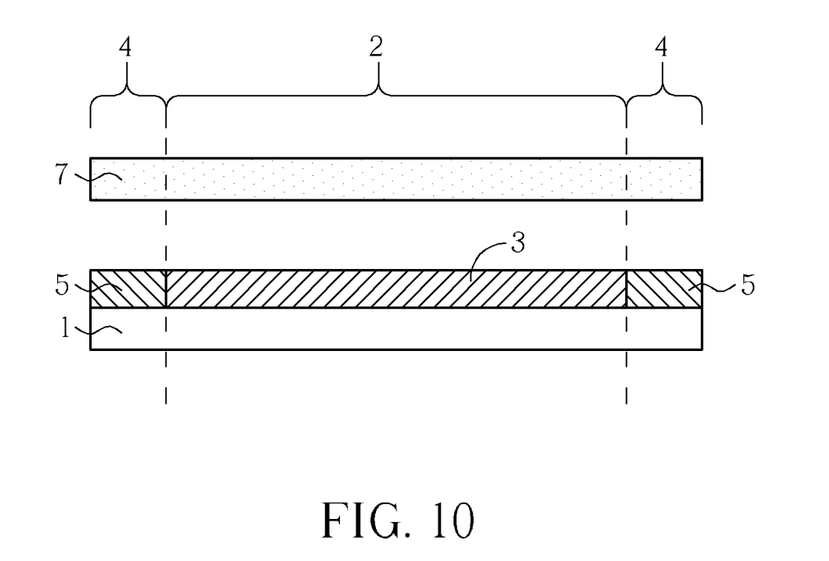

In this embodiment, the cutting process is not limited to cut the first loading substrate 1 and the first flexible substrate 7 along the fringe of the center area 2 of the first loading substrate 1. Referring to FIG. 9 and FIG. 10 combined with FIG. 1 to FIG. 5, FIG. 9 and FIG. 10 are schematic diagrams illustrating a method of manufacturing a flexible substrate structure in accordance to a variant of the first embodiment of the present invention. As illustrated in FIG. 9, different from the cutting process disclosed in FIG. 6 to FIG. 8, this variant embodiment shows that the second adhesive layer 5 is cut along the gap between the first loading substrate 1 and the first flexible substrate 7 in the cutting process, as indicated by arrow. The depth of cutting must penetrate through the second adhesive layer 5 to reach the first adhesive layer 3 such that the second adhesive layer 5 is left on the surface of the first loading substrate 1. Any kind of methods could be adopted in the cutting process, e.g. the cutting methods conducted with thin knife or steel thread as tool, as long as the method could penetrate deeply into the area between the first loading substrate 1 and the first flexible substrate 7 without damaging the substrate surface. Then, the external force perpendicular to the first loading substrate 1 is applied in the cutting region of the second adhesive layer 5 to separate the first flexible substrate 7 and the first loading substrate 1, as illustrated in FIG. 10.

Figure 11:
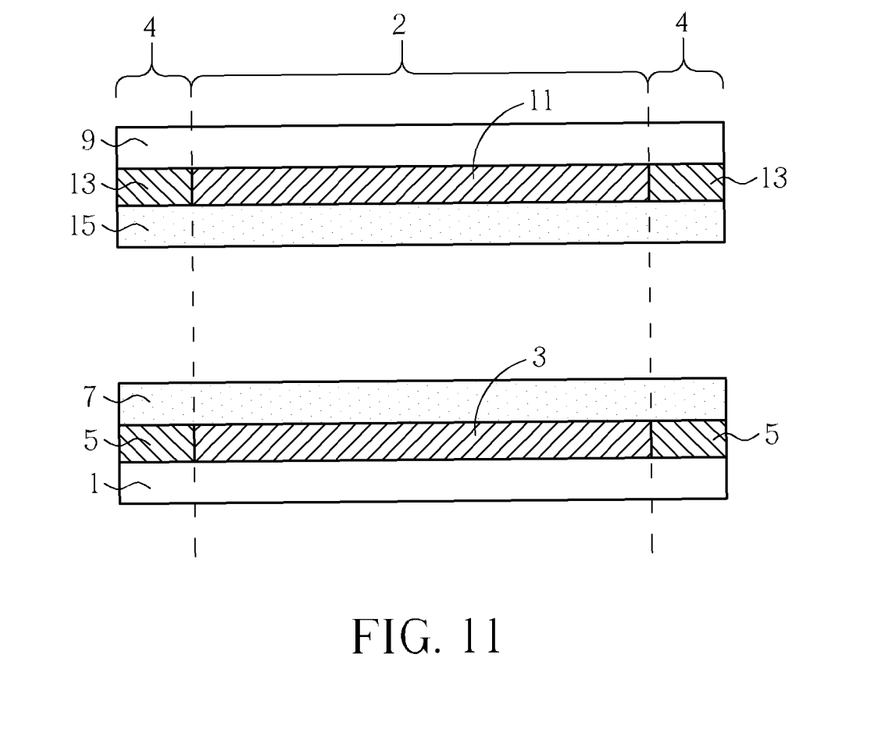
FIG. 11 to FIG. 15 are schematic diagrams illustrating a method of manufacturing a flexible flat device in accordance to the second embodiment of the present invention.

Referring to FIG. 11 to FIG. 15, FIG. 11 to FIG. 15 are schematic diagrams illustrating a method of manufacturing a flexible flat device in accordance to the second embodiment of the present invention. As illustrated in FIG. 11, the flexible substrate structure, such as shown in FIG. 5, is provided. Additionally, similar to the method shown in FIG. 1 to FIG. 5 is used to provide the second loading substrate 9. The third adhesive layer 11 is formed on the center area 2 of the second loading substrate 9, and the fourth adhesive layer 13 is formed on the peripheral area 4 of the second loading substrate 9. The fourth adhesive layer 13 is formed around of the third adhesive layer 11 and connects to the third adhesive layer 11. Then, the second flexible substrate 15 is adhered to the second loading substrate 9 by the third adhesive layer 11 and the fourth adhesive layer 13.

At least a pixel array including at least two conductive lines substantially perpendicular to each other is formed on the surface of the first flexible substrate 7. Each pixel dependently includes at least one transistor or other electronic element, e.g. capacitor or electron emitting component. Besides, the color filter array, e.g. red, green and blue color filter or electrodes, could be formed on the surface of the second flexible substrate 15 corresponding to the pixel array on the surface of the first flexible substrate 7.

Figure 12:
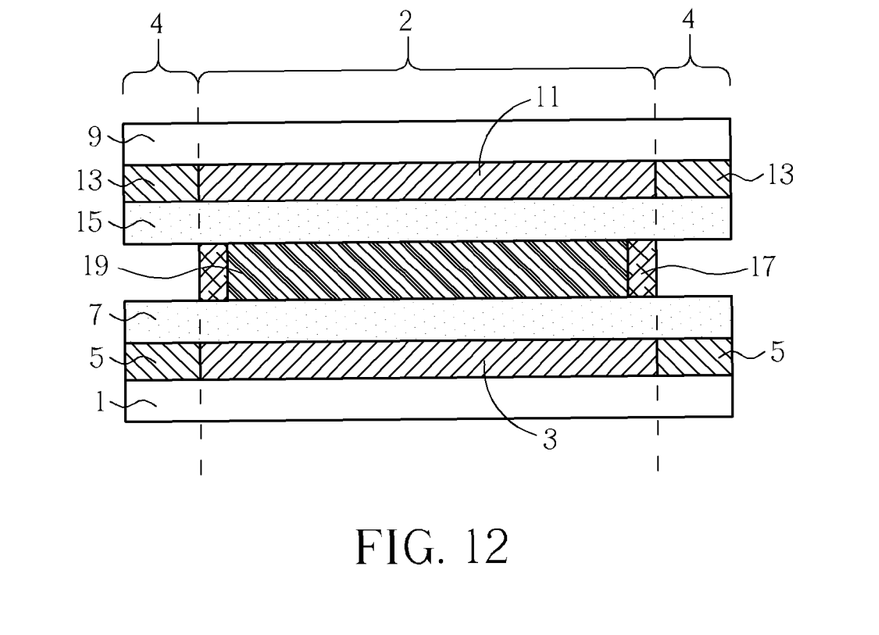

As illustrated in FIG. 12, the first flexible substrate 7 and the second flexible substrate 15 are adhered by a fifth adhesive layer 17. The material of the second flexible substrate 15 could be selected form the same kind of material of the first flexible substrate 7. In order to control whether or not the light transmitted from one flexible substrate could pass through to reach the other flexible substrate, the light modulating layer 19 is filled between the first flexible substrate 7 and the second flexible substrate 15. For instance, the light modulating layer 1 could be a liquid crystal layer for an LCD display. Whether or not the light can pass through is determined by the voltage applied to the electrodes located on both sides of liquid crystal layer. Another example of the flexible flat device is the electronic paper device. The light modulating layer 19 could be the ionized micro particle layer. The electronic paper could appear black or white by applying positive or negative voltage on electrode of flexible substrate to control the particle movement.

In addition, the adhesive force between the second flexible substrate 15 and the fourth adhesive layer 13 is stronger than that between the second flexible substrate 15 and the third adhesive layer 11. The adhesive force between the first flexible substrate 7 and the second adhesive layer 5, and that between the second flexible substrate 15 and the fourth adhesive layer 13 are substantially more than 0.15 N/inch. However, the adhesive force between the first flexible substrate 7 and the first adhesive layer 3, and that between the second flexible substrate 15 and the third adhesive layer 11 are substantially less than 0.05 N/inch. Besides, the adhesive force between the first adhesive layer 3 and the first loading substrate 1 is preferably stronger that that between the first adhesive layer 3 and the first flexible layer 7, and the adhesive force between the third adhesive layer 11 and the second loading substrate 9 is preferably stronger that that between the third adhesive layer 11 and the second flexible layer 15. In that way, when the first loading substrate 1 and the second loading substrate 9 are separated, the problem of residual of the first adhesive layer 3 on the first flexible substrate 7 or the residual of the third adhesive layer 11 on the second flexible substrate 15 would be minor. The adhesive force between the first flexible substrate 7 and the fifth adhesive layer 17 is stronger than that between the first flexible substrate 7 and the second adhesive layer 5, and the adhesive force between the second flexible substrate 15 and the fifth adhesive layer 17 is stronger than that between the second flexible substrate 15 and the fourth adhesive layer 13. The adhesive force between the fifth adhesive layer 17, and the first flexible substrate 7 or the second flexible substrate 15 is substantially more than 0.5 N/inch.

Figure 13:
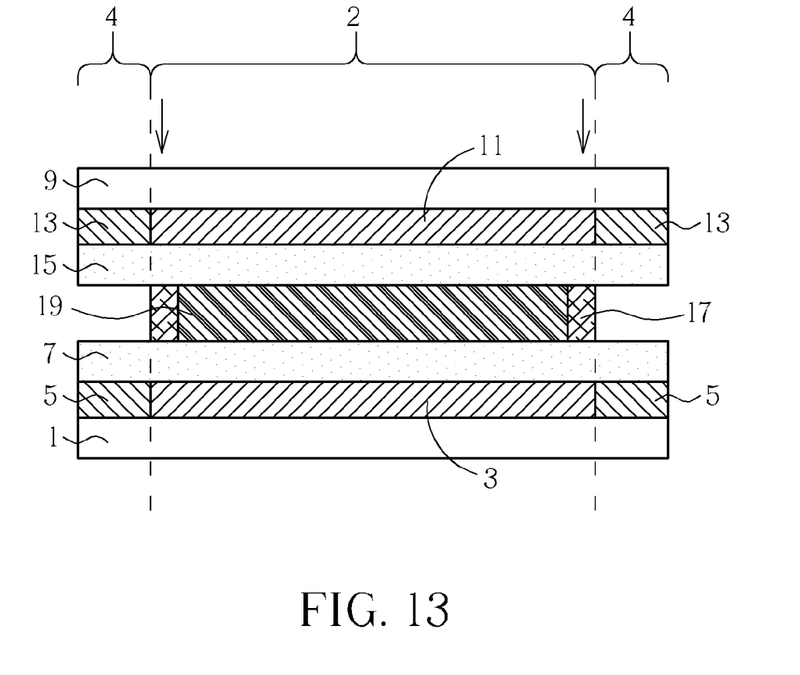
Figure 14:
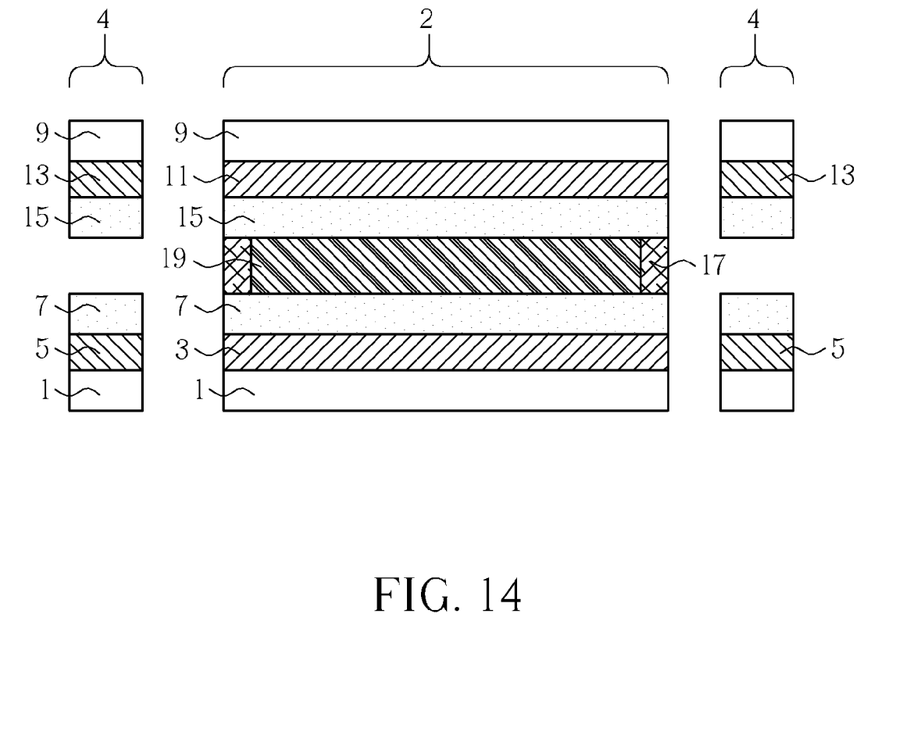
Figure 15:
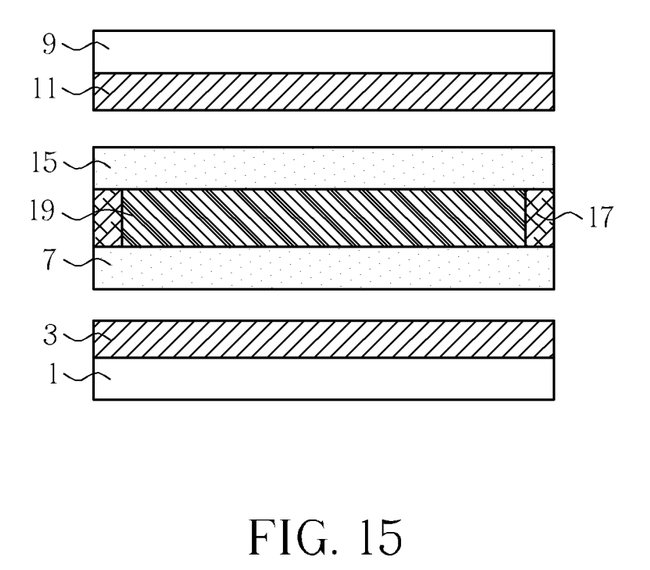

As illustrated in FIG. 13, the cutting process is conducted next. The first loading substrate 1, the second loading substrate 9, the first flexible substrate 7 and the second flexible substrate 15 are cut along the fringe of center area 2 of the first loading substrate 1. The "fringe" means the inner side of the center area 2 here, as shown by the arrow in FIG. 13. The peripheral area 4 and the center area 2 of the first loading substrate 1 and the second loading substrate 9 are separated after cutting, as illustrated in FIG. 14. Then, the external force is applied between the first flexible substrate 7 and the first adhesive layer 3, and between the second flexible substrate 15 and the third adhesive layer 11. Since the adhesive force of the first adhesive layer 3 is less than the second adhesive layer 5 and the adhesive force of the third adhesive layer 11 is less than the fourth adhesive layer 13, the first flexible substrate 7 and the second flexible substrate 15 could be easily separated from the center area 2 of the first loading substrate 1 and the second loading substrate 9 after cutting, while the first flexible substrate 7 and the second flexible substrate 15 are connected by the fifth adhesive layer 17, as illustrated in FIG. 15.

The laser cutting method could be adopted in the cutting process of this embodiment but is not limited. Any process, e.g. the wheel cutting method or other cutting methods, could be adopted in the cutting process of this invention as long as the methods can be used to cut the first loading substrate 1, the second loading substrate 9, the first flexible substrate 7 and the second flexible substrate 15 at the same time.

Figure 16:
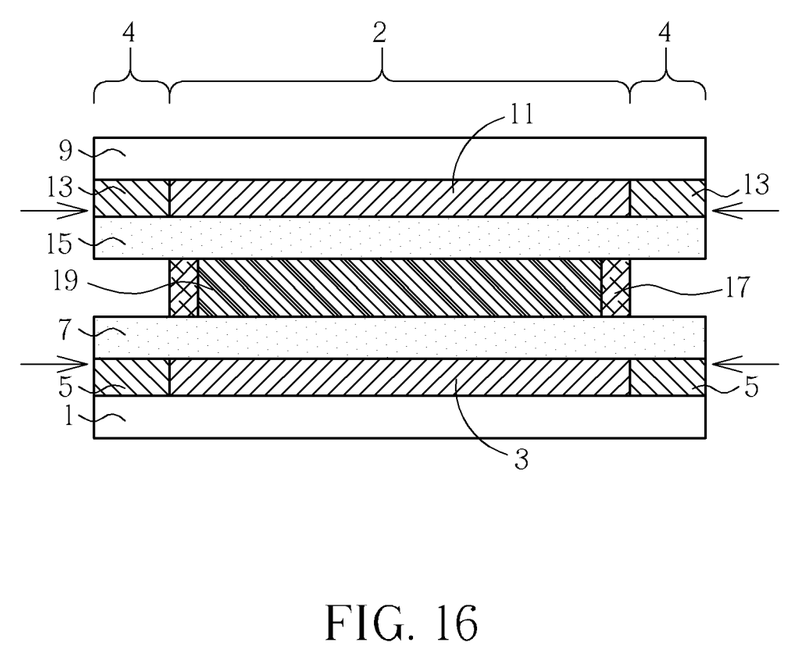
FIG. 16 and FIG. 17 are schematic diagrams illustrating a method of manufacturing a flexible flat device in accordance to the variety of the second embodiment of the present invention.
Figure 17:
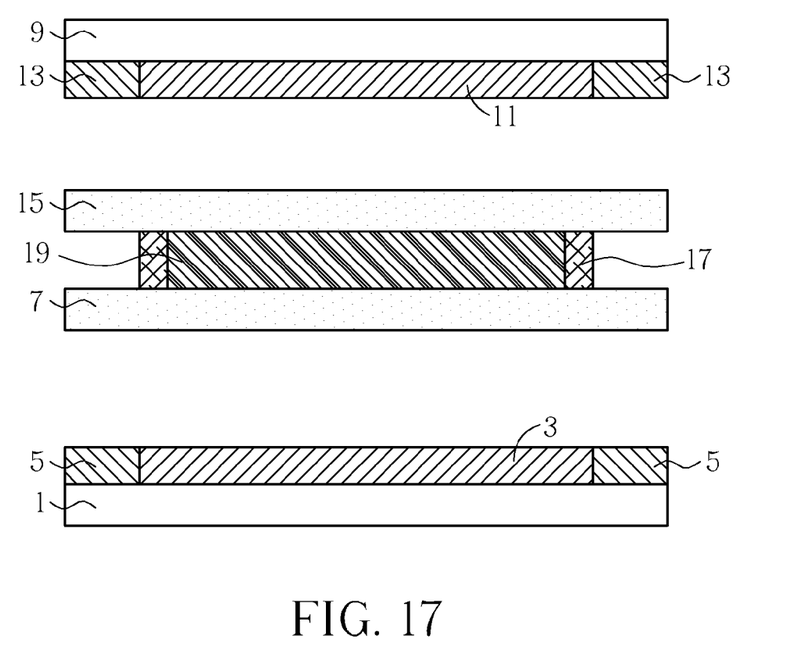

Referring to FIG. 16 and FIG. 17 combined with FIG. 11 and FIG. 12, FIG. 16 and FIG. 17 are schematic diagrams illustrating a method of manufacturing a flexible flat device in accordance to a variant of the second embodiment of the present invention. As illustrated in FIG. 16, different from the cutting process disclosed in FIG. 13 to FIG. 15, this variant embodiment shows that the second adhesive layer 5 is cut along the gap between the first loading substrate 1 and the first flexible substrate 7, and the fourth adhesive layer 13 is cut along the gap between the second loading substrate 9 and the second flexible substrate 15 in the cutting process, as indicated by arrow. The cutting depth is required to penetrate the second adhesive layer 5 to reach the first adhesive layer 3 such that the second adhesive layer 5 is left on the surface of the first loading substrate 1, and to penetrate the fourth adhesive layer 13 to reach the third adhesive layer 11 such that the fourth adhesive layer 13 is left on the surface of the second loading substrate 9. Then, the external force perpendicular to the first loading substrate 1 is applied to the cutting area of the second adhesive layer 5 to separate the first flexible substrate 7 from the first loading substrate 1, and the external force perpendicular to the second loading substrate 9 is applied to the cutting area of the fourth adhesive layer 13 to separate the second flexible substrate 15 from the second loading substrate 9, as illustrated in FIG. 17. Any kind of methods could be adopted in the cutting process, e.g. the cutting methods conducted with thin knife or steel thread as tool, as long as the method could penetrate deeply into the area between the first loading substrate 1 and the first flexible substrate 7 without damaging the substrate surface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a flexible substrate structure, comprising:
    providing a first loading substrate having a center area and a peripheral area disposed on at least one side of the center area;
    forming a first adhesive layer on the center area of the first loading substrate;
    forming a second adhesive layer on the peripheral area of the first loading substrate;
    adhering a first flexible substrate to the first loading substrate by the first adhesive layer and the second adhesive layer to form a flexible substrate structure, wherein an adhesive force between the first flexible substrate and the second adhesive layer is stronger than that between the first flexible substrate and the first adhesive layer;
    cutting the flexible substrate structure comprising cutting the second adhesive layer along a direction parallel to the first loading substrate and the first flexible substrate from a gap between the first loading substrate and the first flexible substrate; and
    separating the first flexible substrate from the first loading substrate, the first adhesive layer and the second adhesive layer.

2. The method according to claim 1, wherein the adhesive force between the first flexible substrate and the second adhesive layer is substantially more than 0.15 N/inch.

3. The method according to claim 1, wherein an area ratio of the peripheral area to the center area of the first loading substrate is substantially more than 0.5.

4. A method of manufacturing a flexible flat device, comprising: providing a first loading substrate having a center area and a peripheral area disposed on at least one side of the center area; forming a first adhesive layer on the center area of the first loading substrate; forming a second adhesive layer on the peripheral area of the first loading substrate; adhering a first flexible substrate to the first loading substrate by the first adhesive layer and the second adhesive layer, wherein an adhesive force between the first flexible substrate and the second adhesive layer is stronger than that between the first flexible substrate and the first adhesive layer; providing a second loading substrate having a center area and a peripheral area disposed on at least one side of the center area; forming a third adhesive layer on the center area of the second loading substrate; forming a fourth adhesive layer on the peripheral area of the second loading substrate; adhering a second flexible substrate to the second loading substrate by the third adhesive layer and the fourth adhesive layer, wherein an adhesive force between the second flexible substrate and the fourth adhesive layer is stronger than that between the second flexible substrate and the third adhesive layer; adhering the first flexible substrate to the second flexible substrate by a fifth adhesive layer to form a flexible substrate structure, wherein an adhesive force between the first flexible substrate and the fifth adhesive layer is stronger than that between the first flexible substrate and the second adhesive layer, and an adhesive force between the second flexible substrate and the fifth adhesive layer is stronger than that between the second flexible substrate and the fourth adhesive layer; cutting the flexible substrate structure comprising: cutting the second adhesive layer along a direction parallel to the first loading substrate and the first flexible substrate from a gap between the first loading substrate and the first flexible substrate, separating the first flexible substrate from the flexible substrate structure; and cutting the fourth adhesive layer along a direction parallel to the first loading substrate and the second flexible substrate from a gap between the second loading substrate and the second flexible substrate, separating the second flexible substrate from the flexible substrate structure.

5. The method according to claim 4, wherein the adhesive force between the first flexible substrate and the second adhesive layer is substantially more than 0.15 N/inch, the adhesive force between the second flexible substrate and the fourth adhesive layer is substantially more than 0.15 N/inch, the adhesive force between the fifth adhesive layer and the first flexible substrate is substantially more than 0.5 N/inch, and the adhesive force between the fifth adhesive layer and the second flexible substrate is substantially more than 0.5 N/inch.

6. The method according to claim 4, wherein the step of cutting the flexible substrate structure includes cutting the first loading substrate, the first flexible substrate, the second flexible substrate and the second loading substrate along a fringe of the center area of the first loading substrate to separate the first flexible substrate from the first loading substrate, and to separate the second flexible substrate from the second loading substrate.

7. The method according to claim 4, wherein the step of cutting the flexible substrate structure includes:
    cutting the second adhesive layer along a gap between the first loading substrate and the first flexible substrate to separate the first flexible substrate from the first loading substrate; and
    cutting the fourth adhesive layer along a gap between the second loading substrate and the second flexible substrate to separate the second flexible substrate from the second loading substrate.

8. The method according to claim 4, wherein before adhering the first flexible substrate and the second flexible substrate, the method further comprises:
    forming a light modulating layer between the first flexible substrate and the second flexible substrate.

9. The method according to claim 8, wherein the light modulating layer includes a liquid crystal layer.

10. The method according to claim 4, wherein an area ratio of the peripheral area to the center area of the first loading substrate is substantially more than 0.5.

* * * * *